United States Patent [19]

Aldersberg

[11] Patent Number: 4,907,276
[45] Date of Patent: Mar. 6, 1990

[54] FAST SEARCH METHOD FOR VECTOR QUANTIZER COMMUNICATION AND PATTERN RECOGNITION SYSTEMS

[75] Inventor: Shabtai Aldersberg, Ramat Gan, Israel

[73] Assignee: The DSP Group (Israel) Ltd., Ramat HaSharon, Israel

[21] Appl. No.: 177,981

[22] Filed: Apr. 5, 1988

[51] Int. Cl.$^4$ .............................................. G10L 5/00
[52] U.S. Cl. ........................................ 381/36; 381/35; 381/43; 381/31
[58] Field of Search ..................... 381/31, 35, 36, 43; 364/725

[56] References Cited

U.S. PATENT DOCUMENTS 3,981,443  9/1976  Lynch et al. ........................ 364/725
4,270,025  5/1981  Alsup ................................... 381/31

OTHER PUBLICATIONS

Digital Coding of Waveforms, by N. S. Jayant and Peter Noll, Prentice-Hall, Inc., pp. 536 and 537.
Adaptive Signal Processing, by Bernard Widrow and Samuel D. Stearns, Prentice-Hall, Inc., p. 38.
Vector Quantization of Speech and Speech-Like Waveforms IEEE Trans. Acoust., Speech and Sig. Process, H. Abut et al., ASSP-30, pp. 423-436, Jun. 1982.
Vector Quantization, R. M. Gray, IEEE ASSP Magazine, pp. 4-27, Apr. 1984.
Vector Quantization: A Pattern-Matching Technique for Speech Coding, A. Gersho et al., IEEE Communications Magazine, 1983, pp. 15-21.

*Primary Examiner*—Emanuel S. Kemeny
*Attorney, Agent, or Firm*—Finnegan, Henderson, Farabow, Garrett and Dunner

[57] ABSTRACT

An encoder apparatus for communication and pattern recognition systems employing a nearest neighbor search method for signal and data compression, based on a vector encoding quantization technique which optimizes systems performance with substantially reduced computational complexity using a fast geometrically-oriented search procedure. The apparatus comprises pre-procesing apparatus for providing off-line reorganization of a codebook having a set of reference vector patterns constituting codevectors with which the input vector is to be compared in a search procedure, and on-line apparatus for encoding the random input vector through quantization in accordance with the search procedure in the codebook. The on-line encoding apparatus comprises: apparatus for providing a transform domain vector having a set of eigenvectors associated therewith; apparatus for determining a surface vector nearest to the transform domain vector on the axis having the largest variance; apparatus for determining a distance value providing the distortion between the transform domain vector and the surface vector, defined by the Euclidean distance; apparatus for determining a codebook contiguous sub-group range having contained therewithin codevectors and being bounded by a hypersphere having a k-dimensional radius defined as the square root of the distance value; and apparatus for performing a full search over the contiguous sub-group range within the hypersphere to select the one of the codevectors nearest to the transform domain vector for encoding it in accordance with the one selected codevector.

22 Claims, 2 Drawing Sheets

FAST SEARCH METHOD FOR VECTOR QUANTIZER COMMUNICATION AND PATTERN RECOGNITION SYSTEMS

FIELD OF THE INVENTION

The present invention relates to communication and pattern recognition systems employing nearest neighbour search methods in coding and classification for signal and data compression, and more particularly, to a source coder apparatus applying a vector encoding quantization technique which optimizes system performance with substantially reduced computational complexity using a fast, geometrically-oriented search procedure.

BACKGROUND OF THE INVENTION

It is known in the prior art of speech signal compression techniques used in communication systems to apply vector quantization, based on the operation of a source coder for coding contiguous blocks of samples as a vector rather than as isolated samples based on scalar quantization. In vector quantization systems, each input vector is encoded with a binary codeword, selected by means of comparison with a set of stored reference vectors, known as codevectors or patterns, which form a codebook. A nearest neighbour pattern matching technique based on a search procedure is used to encode the input vector by the best matching pattern according to the pre-stored codebook.

Rate distortion theory guarantees a performance arbitrarily close to the optimum for waveform vector quantizers operating on vectors of sufficiently large dimension. However, this theoretical result has had little impact on the use of vector quantization in currently available coding systems. This is mainly due to the complexity of their real-time implementation, which exhibits exponential growth with the vector dimension at a given bit rate.

The complexity issues associated with the implementation of vector quantization are broadly discussed in two tutorial papers entitled "Vector quantization", R. M. Gray, IEEE ASSP Magazine, pp. 4–27, Apr. 1984 and "Vector Quantization: A Pattern-Matching Technique for Speech Coding", A. Gersho and V. Cuperman, IEEE Communications Magazine, 1983, pp. 15–21. As stated therein, the implementation complexity in signal processing hardware is related to two main factors: computational complexity and the memory capacity required for the quantization process.

With regard to the computational complexity problem, the main obstacle to using vector quantization for high dimensional vectors is based on the fact that a k-dimensional vector quantizer operating at a rate of r bits/sample, requires a number of computations per sample of the order of $2^{kr}$ and a memory of $k2^{kr}$ words if a full search through the codebook is performed for each input vector.

In a full search procedure, also known as an exhaustive search procedure, each codevector in the codebook has to be tested to determine if it is the nearest codevector to the input vector. The criterion for the nearest codevector (or best match) is determined on the basis of the minimal distortion associated with representing the input vector by it nearest codevector.

The distortion measure is the minimum mean square error (MMSE) which is expressed by means of the Euclidean distance between the two vectors. Thus, a full search procedure is comprised of calculations for the distortion or the distance between the input vector and each of the codebook vectors. Performing the search in the original k-dimensional space of the sample process requires the search to consist of the whole space, which is the main difficulty.

Therefore, the use of vector quantization in real-time waveform coding systems has been limited to dimension-rate (kr) products of 8 or less. (See "Vector quantization of speech and speech-like waveforms", IEEE Trans. Acoust., Speech, and Sig. Process, H. Abut, R.M. Gray, and G. Rebolledo, ASSP-30, pp. 423–436, Jun. 1982). Thus, although theoretically able to achieve better performance than scalar PCM. due to the complexity problem, vector quantization is not competitive with more sophisticated scalar speech compression methods such as ADPCM, transform coding, or subband coding techniques.

Attempts to circumvent the complexity problem are described in the aforementioned Gray and Gersho papers. Alternatives to the optimal yet exhaustive full search of the codebook in vector quantization techniques have been developed in the past few years. However, the majority of these are sub-optimal algorithms which operatate on the original measured vectors (usually in the time domain) in order to reduce complexity.

Therefore, it is desirable to provide an optimal, fast search method for communication systems employing vector quantization systems for speech signal compression, which efficiently reduces computational complexity.

SUMMARY OF THE INVENTION

Accordingly, it is a principal object of the invention to overcome the above-mentioned disadvantages and provide a communications system employing an efficient vector quantization method which exhibits reduced complexity based on a novel, fast search method using a pattern matching technique.

In accordance with the invention, there is provided an apparatus for encoding speech signals represented by a random input vector having k components, said apparatus comprising:

pre-processing means for providing off-line reorganization of a codebook having a set of reference vector patterns constituting codevectors with which the input vector is to be compared in a search procedure, said pre-processing means comprising:
  means for transforming each of said codebook codevectors to provide a transform domain representation of said codebook;
  means for determining a principal axis p having the largest variance in said codebook transform domain representation; and
  means for re-ordering said codebook codevectors according to their descending value on the p axis; and on-line means for encoding the random input vector through quantization in accordance with said search procedure in the codebook, said on-line encoding means comprising:
  means for transforming the input vector to provide a transform domain vector having a set of eigenvectors associated therewith;
  means for determining a surface vector nearest to said transform domain vector on said principal axis;

means for determining a distance value providing the distortion between said transform domain vector and said surface vector, said distance value being defined as the Euclidean distance between said vectors and being the Minimum Mean Square Error (MMSE) distortion criteria;

means for determining a codebook contiguous sub-group range having contained therewithin codevectors and being bounded by a hypersphere having a k-dimensional radius defined as the square root of said distance value;

means for performing a full search over said contiguous sub-group range within said hypersphere to select the one of said codevectors nearest to said transform domain vector by determining the distortion therebetween in accordance with said MMSE criteria; and means for encoding said tranform domain vector in accordance with said one selected codevector.

In a preferred embodiment, the inventive vector quantization communication system is configured as a source coder which provides block quantization by operating on a block of consecutive signal samples rather than on isolated samples as in scalar quantization. The block of samples constituting the input vector X is coded by resort to a novel search procedure conducted over a stored set of reference vectors contained in a codebook, so that a comparison between the input vector and the codebook vector can be performed efficiently to determine the proper coding.

The novel search procedure is defined by a full search over a hypersphere (a relatively small sub-space compared to the original k-dimensional space containing the whole set of codevectors) which has been determined to contain the appropriate (best matching) codebook vector. Since the hypersphere is defined as a relatively small k-dimensional space centered around the input vector, a relatively small subset of the codebook must be searched to select the nearest codevector for coding purposes. This results in a shorter and more efficient search procedure. The definition of the hypersphere is based on a geometrically-oriented approach related to the dominance of one of the eigenvalues associated with the input vector relative to the other eigenvalues.

In the preferred embodiment, the means for transforming the input vector X to provide the transform domain vector $Z_t$ is provided by a Karhunen-Loewe Transform (KLT) which, under the MMSE criterion, achieves minimal representation of the input source in terms of packing the process energy into the least number of meaningful coefficients and in achieving the best decorrelation of the input vector components.

In another embodiment, since the KLT exhibits implementation complexity problems, (matrix inversion, etc.), similar, signal independent transforms can be used. The discrete cosine transform (DCT) which is close in performance to the KLT for correlated sources is such a transform, and is generally used to encode speech signals.

Also in the preferred embodiment, the means for determining the surface vector ($Z_s$) nearest to the transform domain vector $Z_t$ on the principal axis operates in accordance with the following relation defining $Z_s$:

$$Z_s = (Z_{tp} - Z_{sp})^2 \leq (Z_{tp} - Z_{np})^2 \quad 1 \leq n \leq N$$

where the complexity of this principal axis search is of the order of $Log_2 N$ since it is done through a binary search along a sorted group of values (the codevectors p axis components).

Another aspect of the preferred embodiment is that the means for determining the distance value providing the distortion between the transform domain vector $Z_t$ and the surface vector $Z_s$ determines the Euclidean distance between them in accordance with the relation:

$$d(Z_t, Z_s) = \sum_{i=1}^{k} (Z_{ti} - Z_{si})^2.$$

Still further with respect to the preferred embodiment, the means for determining the codebook contiguous sub-group range has contained therewithin codevectors $Z_j$ and is bounded by high and low bounds determined by Zh, Zl where:

$$Z_{hp} < Z_{tp} + r_p < Z_{(h+1)p};$$

and $$Z_{(l-1)p} < Z_{tp} - r_p < Z_{lp}$$

which is essentially a hypersphere having a k-dimensional radius $r_p$ defined as:

$$r_p = SQRT(d(Z_t, Z_s)).$$

A feature of the invention is that there is provided. in recursive fashion, a combined operation of the plurality of means for determining the surface vector, determining the distance value, determining the codebook sub-group range in the hypersphere and performing the full search over the sub-group range within the hypersphere. As a result, each determination of a nearer codevector establishes it as the new nearest codevector, and initiates the repetition of the combined operation of the plurality of means for determining the new hypersphere for the subsequent full search, wherein the means for determining the surface vector operates by substitution of the current surface vector for the new nearest codevector.

In accordance with another aspect of the invention, there is provided a method for encoding speech represented by a random input vector having k components, said method comprising the steps of:

pre-processing to provide off-line reorganization of a codebook having a set of reference vector patterns constituting codevectors with which the input vector is to be compared in a search procedure, said pre-processing step comprising the steps of:

transforming each of said codebook codevectors to provide a transform domain representation of said codebook;

determining a principal axis p having the largest variance in said codebook transform domain representation; and re-ordering said codebook codevectors according to their descending value on the p axis; and encoding the random input vector through on-line quantization in accordance with said search procedure in the codebook, said on-line encoding step comprising the steps of:

transforming the input vector to provide a transform domain vector having a set of eigenvectors associated therewith;

determining a surface vector nearest to said transform domain vector on said principal axis;

determining a distance value providing the distortion between said transform domain vector and said surface vector, said distance value being defined as the Euclidean distance between said vectors and being the Minimum Mean Square Error (MMSE) distortion criteria;

determining a codebook contiguous sub-group range having contained therewithin codevectors and being bounded by a hypersphere having a k-dimensional radius defined as the square root of said distance value;

performing a full search over said contiguous sub-group range within said hypersphere to select the one of said codevectors nearest to said transform domain vector by determining the distortion therebetween in accordance with said MMSE criteria; and encoding said transform domain vector in accordance with said one selected codevector.

Other features and advantages of the present invention are described in the following drawings and description.

BRIEF DESCRIPTION OF THE DRAWINGS

For a better understanding of the invention with regard to the preferred embodiments thereof, reference is made to the accompanying drawings in which like numerals and symbols designate corresponding sections or elements throughout, and in which.

DETAILED DESCRIPTION OF THE PREFERRED EMBODIMENTS

Figure 1:
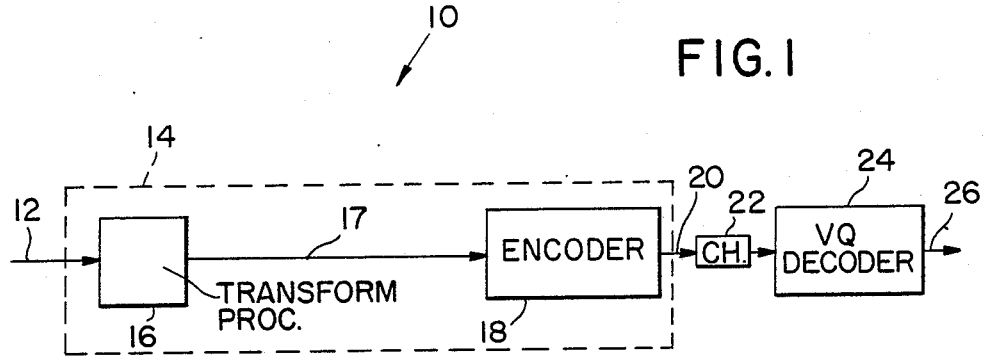
FIG. 1 shows a schematic block diagram of a communication system constructed and operated in accordance with a transform domain vector quantization technique incorporating the principles of the present invention.

Referring now to FIG. 1, there is shown a schematic block diagram of a communication system 10 constructed and operated in accordance with the principles of the present invention. The output of a signal sampling and a block encoding technique such as vector PCM (VPCM), which is not part of the scope of the present invention, is provided as an input vector 12 represented as X and containing a block of several consecutive signal samples, having dimension k. Input vector 12 is fed to a source coder 14, which is a vector quantizer (VQ) and operates on the vector as a unit rather than on isolated samples as in scalar quantization. As will be described further herein, the problem of encoding complexity which is normally encountered in prior art optimal vector quantization techniques is overcome by application of a novel approach providing efficient quantization in the transform domain.

Source coder 14 comprises a transform processor 16 and a vector encoder 18. Input vector 12 is fed to transform processor 16 and exits as transformed signal 17 which is fed to encoder 18. The output of encoder 18 is a signal 20 which has been encoded in accordance with the vector quantization technique of the present invention. Encoded signal 20 is provided via transmission channel 22 to a decoder 24 which decodes the transmitted signal to provide a reconstructed signal 26 by resort to a decoding procedure, using a lookup table procedure according to the received index.

In accordance with the present invention, a novel approach to efficient quantization is achieved based on signal transformation into its eigenspace. Relying on the compact structure of the source (input process) in the transform domain, a hypersphere (HS) search procedure is carried out, which reduces the complexity of computation associated with prior art procedures. The structured, two-level HS search procedure avoids the full search procedure over the whole k-dimensional space to achieve optimal quantization. Based on the phenomenon of the maximum spread of the signal eigenvalues in the transform domain, the search is focused and restricted to a relatively small k-dimensional sub-space spanned by only a subset of the codebook vectors.

A mathematical analysis of the transform domain vector quantization technique is now presented. The encoding process in a k-dimensional N-level waveform VQ such as source coder 14 consists of choosing the "best" representing codebook vector $Y_i$ for the input vector 12 (X), in accordance with the Minimum Mean Square Error (MMSE) distortion criteria. The general goal of a properly designed VQ is to minimize the average distortion introduced by coding the source, defined as:

$$D(r,k) = E\{d(X,Y)\} \qquad (1)$$

where E is the expected value, $d(X,Y)$ is a distortion measure, and r is the VQ rate. In a transform domain-based VQ, input vector 12 is first transformed by transform processor 16 into a vector Z (transformed signal 17) using a unitary linear mapping A:

$$Z = AX \qquad (2)$$

Under the MMSE distortion criterion, the optimal transform A is the Karhunen-Loewe Transform (KLT) formed by the eigenvectors of the covariance matrix of the source, represented by the input vector 12. The KLT is also known to achieve maximum compactness of the source in terms of minimal representation and is best in providing the highest degree of the vector components decorrelation.

Once KLT transformation of input vector 12 has been performed by processor 16, vector quantization of transformed signal 17 (vector Z) is provided by encoder 18 using the HS search procedure now described. The encoded signal 20 contains the argument of a vector $Z_c$ which is nearest to the vector Z, expressed as $\arg(Z_c)$. The argument is provided by the HS search procedure via a fast search method which retains optimal performance at substantially reduced computational complexity compared to a VQ using the Full Search (FS) method. This is based on a geometrically-oriented approach which relies on the dominance of one of the eigenvalues of the input process relative to the other eigenvalues, a feature which generally characterizes moderate dimensional eigenspace representation of correlated sources (k<16).

As an introduction to the invention described further herein, it is pointed out that the Full Search (FS) method in on optimal time-domain VQ is generally not efficient for two main reasons: the first concerns the use of a carefully designed, but arbitrarily organized codebook whose vectors span the k-dimensional space in a random manner. This random structure prevents the use of a systematic, spatially-oriented search approach. The second reason relates to the extent of the search space.

It will be appreciated by those skilled in the art, that in full search vector quantization systems, where X is the input vector and $Y_1$ is the first codebook vector, the first step in a FS procedure is to compute the distortion $D1 = d(X, Y_1)$.

In accordance with the principles of the invention, it is noted that once the distortion D1 has been computed, the search space may be limited to a hypersphere whose center is X and whose k-dimensional radius is given by the square root of $d(X, Y_1)$. Thus, an improvement in the efficiency of the search procedure can be achieved if a reduction in the hypersphere radius is obtained. Since X is a random vector, it is useful to evaluate the expected value of $d(X, Y_1)$. Assuming that X and $Y_1$ are uncorrelated:

$$E\{d(X, Y_1)\} = ||Y_1||^2 + E\{||X||^2\} \tag{3}$$

It can be noted that the sum of X' component variances constitutes the significant term in equation (3). The k components of the k-dimensional vector are the values associated with its projection on each of the k axes defining the k-dimensional space.

Therefore, in accordance with the principles of the invention, it becomes useful to apply a transformation to the source, making it maximally compact. Eliminating the component of the highest variance in the first step of a systematic, axis by axis search, results in a much smaller limiting radius for the subsequent search procedure. It should also be noted that this term becomes smaller as the correlation of the source grows to 1. In fact, for speech signals and vector dimensions k usually used in vector quantization (k<16), the first component variance generally contains 70%14 90% of the signal energy, a fact which advocated the use of the inventive HS search procedure.

Figure 2:
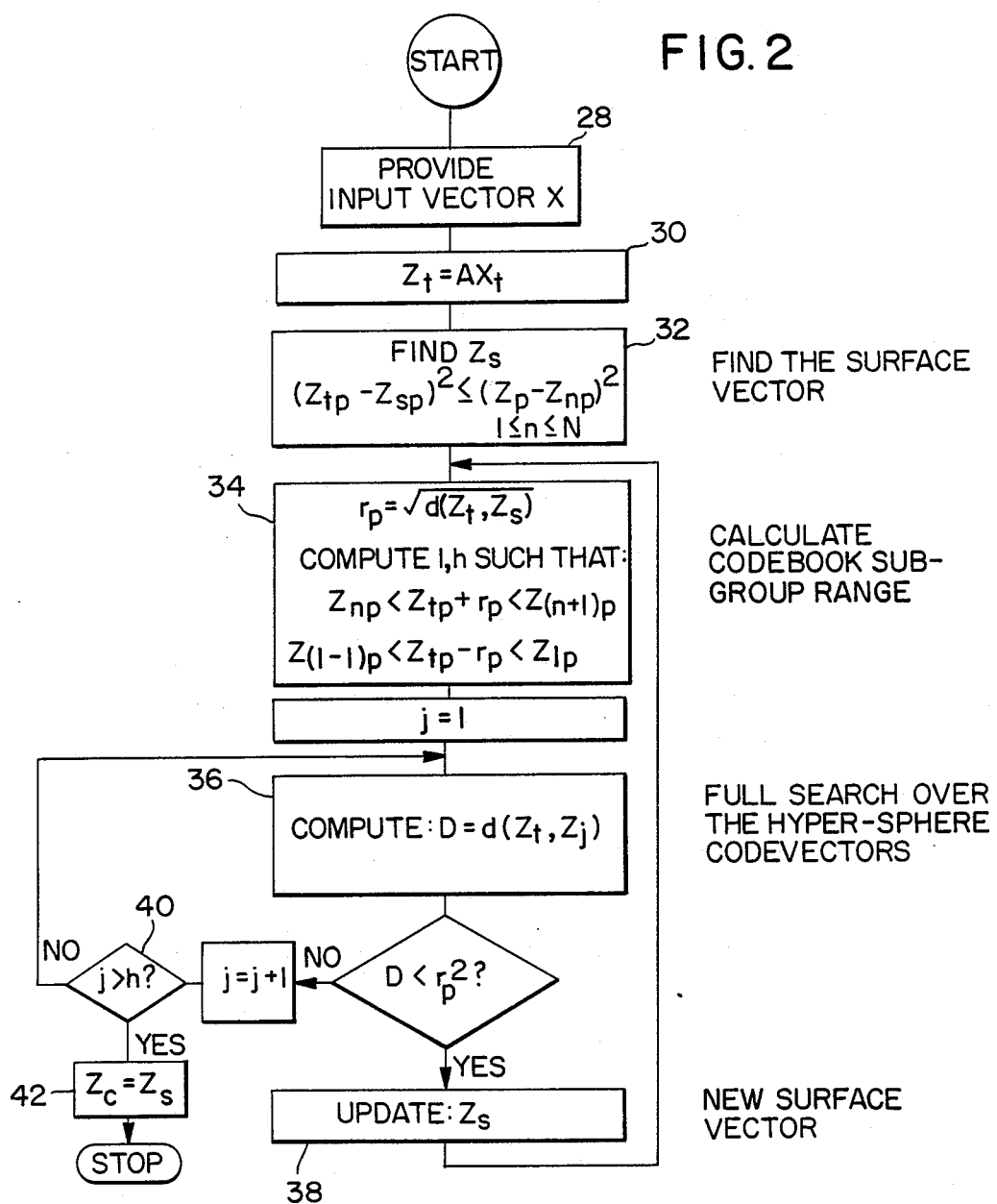
FIG. 2 shows a flowchart of an algorithm for encoding an input vector for transmission in the communication system of FIG. 1 in accordance with a hypersphere search technique of the invention.

Referring now to FIG. 2, there is shown a flowchart of an algorithm for encoding an input vector for transmission in the vector quantization communication system of FIG. 1 in accordance with a hypersphere search technique of the invention. The algorithms of FIG. 2 can be implemented using general-purpose microprocessor hardware in accordance with skill of the art electronic design and programming techniques.

Before beginning the encoding process, an off-line technique is used to reorder the codebook by identifying the principal axis, which is the axis for which the input process has the largest eigenvalue, if the KLT was used, or the largest variance, if another transform, like the DCT has been used. The codebook vectors are then re-ordered according to their descending value on the p axis.

The on-line encoding procedure is now commenced. As stated earlier, the HS search procedure restricts the search for nearest codevector to a relatively small sub-set of the codebook. This sub-set of codevectors define a relatively small k-dimensional hypersphere centered around the input vector X.

In the preferred embodiment, the KLT transform is used, and p is the index of the principal axis, i.e., the axis corresponding to the largest eigenvalue of the source. Block 28 of the algorithm provides the input vector 12 (X) using a sampling process and sample grouping procedure, which is not part of the scope of the present invention. Block 30 provides the transform domain vector $Z_t$ (signal 17) to encoder 18 based on use of the KLT (or the DCT) transform in transform processor 16, which is applied to input vector 12. Block 32 is designed to determine a "surface" vector $Z_s$, which is the nearest codebook vector to the input transformed vector $Z_t$ on the principal axis. Denoting the components of the codewords $Z_i$ by $Z_{ij}$, $j=1,2...,k$, $Z_s$ is defined by:

$$Z_s = (Z_{tp} - Z_{sp})^2 \leq (Z_{tp} - Z_{np})^2 \; 1 \leq n \leq N \tag{4}$$

As implied by its name, surface vector $Z_s$ lies on the surface of a k-dimensional hypersphere which bounds the subsequent search. On the basis of the previously described off-line re-ordering of the codebook vectors according to the decreasing value of their principal component, $Z_s$ is determined using a fast binary speed (of only $Log_2 N$ operations) on the codevectors' p-axis component. The distance between the input transformed vector $Z_t$ (signal 17) and the surface vector $Z_s$ is declared to be the intermediate minimum distortion $(r_p)^2$.

The search procedure is then continued sequentially on a sub-set of codevectors which are determined in algorithm block 34. The codevector sub-set is such that its principal axis component lies inside a bounded interval on the principal axis. The interval center is $Z_{tp}$ and its length is equal to $2r_p$ where:

$$r_p = \text{SQRT}(d(Z_t, Z_s)) \tag{5}$$

Figure 3:
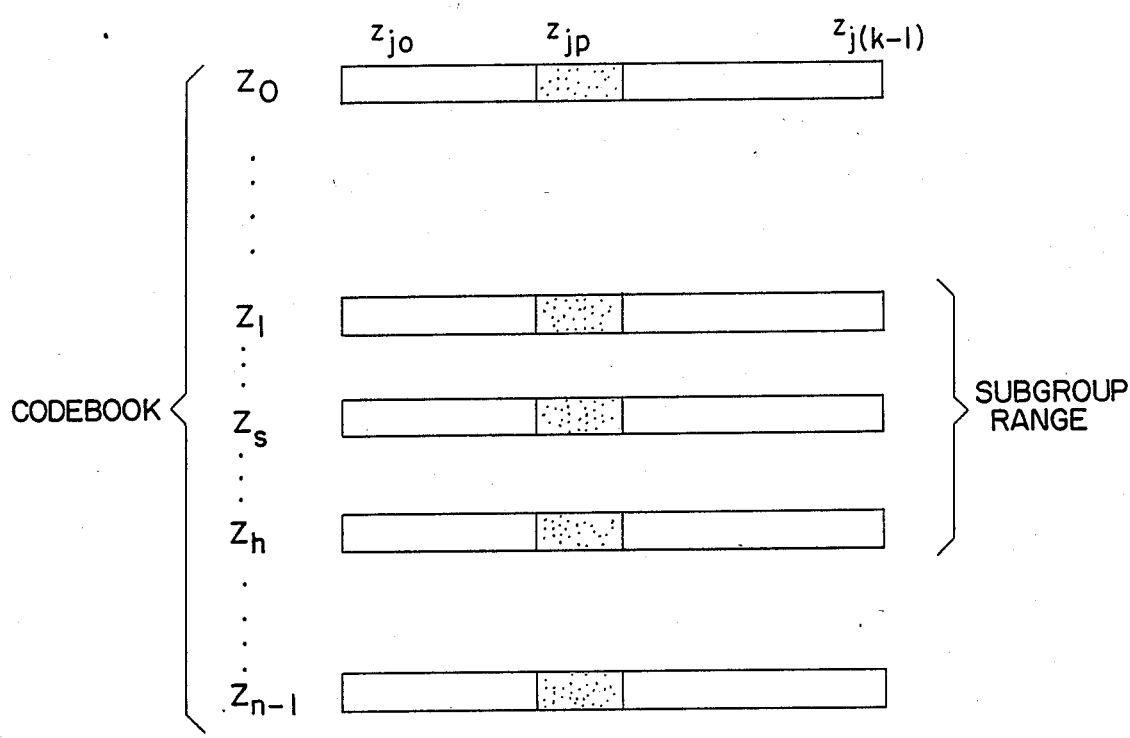
FIG. 3 illustrates a sub-group range within which a full search procedure is carried out in accordance with the technique of the invention.

FIG. 3 illustrates the sub-group range within which the full search procedure is carried out in accordance with the technique of the invention. The bounded interval defining the sub-group range is computed by iterative calculation of parameters l and h such that the following relationships are satisfied:

$$Z_{hp} < Z_{tp} + r_p < Z_{(h+1)p} \tag{6}$$

and $$Z_{(l-1)p} < Z_{tp} - r_p < Z_{lp} \tag{7}$$

Typical ratios of the sub-group range size (h−l) compared to the codebook size (n) are 8:256 (see Table 1).

Block 36 incorporates the calculation of the distance or the distortion between the input vector and each of the codebook vectors. Each codevector $Z_j$, whose distance from the input transformed vector exceeds the previous minimum distance is rejected, and the search for the best representing codevector is continued on the next codevector in the sub-group range.

Once a nearer codevector is found, it is declared to be the current surface vector, lying on the surface of a smaller hypersphere. It is also set to be the candidate for the best matching pattern $Z_c$ until a nearer codevector is found. Next, the HS search sub-group range is recalculated to progressively obtain a smaller hypersphere for the subsequent spatial search.

This further improvement of the HS search algorithm efficiency is achieved by recursive operation, in which the hypersphere center and radius are updated in the order defined by blocks 38, 34 and 36 each time a nearer codevector is found. This requires updating of $Z_s$, determining the distance between $Z_s$ and $Z_t$, determining the codebook sub-group range, and performing the full search over the sub-group range, wherein block 38 operates by substitution of the current surface vector for the new nearest codevector.

Whenever the search of the sub-group is exhausted as tested in block 40, the search for the best matching codevector $Z_c$ is ended, and is set equal to the last surface vector $Z_s$ in block 42.

Figure 4:
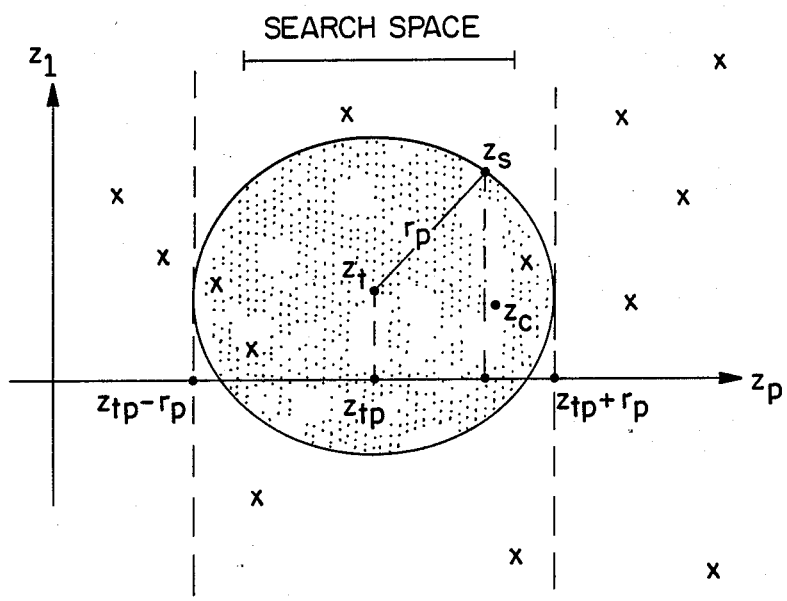
FIG. 4 shows a two-dimensional space (k=2) containing a defined search space, providing a simplified example of the hypersphere search method of the invention.

FIG. 4 illustrates the effect of using the HS search procedure in a two-dimensional VQ system. It is seen that the best representing vector $Z_c$ is contained within the reduced search space provided by the HS search procedure, within the search space being defined by the radius $r_p$.

While not included herein, a mathematical proof of the optimal nature of the HS search algorithm can be readily provided, showing that the nearest codevector is either the surface vector $Z_s$ or a vector which is always included in the iteratively defined sub-set. In comparision with existing fast search techniques such as a tree-search and multi-stage VQ, the inventive communication system using the HS algorithm has the advantage of being optimal and requiring less memory.

Experimental results that have been achieved using the HS search procedure in the inventive communication system are presented in Tables 1 and 2. The transform domain VQ of the invention was simulated and compared to a Full Search (FS) vector quantizer in coding a highly correlated first-order autoregressive source (a=0.9) and sampled speech waveforms. Throughout the experiments, the Discrete Cosine Transform (DCT) was used in simulations, as it has the advantage of being signal independent and close in performance to the KLT for correlated sources. A training sequence of more than an average of 32 vectors per codevector were used in order to evaluate the performance of the various quantizers.

Table 1 presents the average number of codevectors which were searched in optimal vector quantization of a first order autoregressive source encoded at a rate of 1/bit sample. The $2^k$ distances of the Full Search VQ are shown in comparison with the smaller number of vectors searched by the HS search procedure.

TABLE 1

| k | 6 | 7 | 8 | 9 | 10 |
|---|---|---|---|---|---|
| N″ (HS) | 3.8 | 5.4 | 8.3 | 13.1 | 20.6 |
| N (FS) | 64 | 128 | 256 | 512 | 1024 |

Table 2 presents the results for an input signal consisting of 64,000 speech samples.

TABLE 2

| k | 4 | 5 | 6 | 7 | 8 |
|---|---|---|---|---|---|
| N″ (HS) | 2.7 | 3.4 | 3.9 | 4.3 | 4.7 |
| N (FS) | 16 | 32 | 64 | 128 | 256 |

Another potential use for the HS search procedure is to incorporate it into the LBG algorithm described in the paper entitled "An algorithm for vector quantizer design", Y. Linde, A. Buzo, and R. M. Gray, IEEE Trans. Commun., COM-28, pp. 84–95, Jan. 1980. By integrating the HS search method into the LBG VQ codebook design algorithm, a substantial reduction of the design runtime can be achieved. A reduction of the runtime on a VAX-730 computer from several days to a few hours has been measured for several designs.

In conclusion, an efficient transform domain based Vector Quantizer is provided in the inventive communication system, based on an optimal fast HS search procedure which drastically reduces the computational complexity of VQ's in coding correlated sources. In particular, the efficiency exhibited by the HS search procedure lends its use for optimal vector quantization with high dimension-rate products (above 10).

Having described the invention with regard to certain specific embodiments thereof, it is to be understood that the description is not meant as a limitation since further modifications may now suggest themselves to those skilled in the art and it is intended to cover such modifications as fall within the scope of the appended claims.

I claim:

1. An apparatus for encoding speech signals represented by a random input vector having k components, said apparatus comprising:
   pre-processing means for providing off-line reorganization of a codebook having a set of reference vector patterns constituting codevectors with which the input vector is to be compared in a search procedure, said pre-processing means comprising:
   means for transforming each of said codebook codevectors to provide a transform domain representation of said codebook;
   means for determining a principal axis p having the largest variance in said codebook transform domain representation; and
   means for re-ordering said codebook codevectors according to their descending value on the p axis; and
   on-line means for encoding the random input vector through quantization in accordance with said search procedure in the codebook.

2. The apparatus of claim 1 and wherein said on-line means for encoding comprise:
   on-line means for encoding the random input vector through quantization in accordance with said search procedure in the codebook, said on-line encoding means comprising:
   means for transforming the input vector to provide a transform domain vector having a set of eigenvectors associated therewith;
   means for determining a surface vector nearest to said transform domain vector on said principal axis;
   means for determining a distance value providing the distortion between said transform domain vector and said surface vector, said distance value being defined as the Euclidean distance between said vectors and being the Minimum Mean Square Error (MMSE) distortion criteria;
   means for determining a codebook contiguous sub-group range having contained therewithin codevectors and being bounded by a hypersphere having a k-dimensional radius defined as the square root of said distance value;
   means for performing a full search over said contiguous sub-group range within said hypersphere to select the one of said codevectors nearest to said transform domain vector by determining the distortion therebetween in accordance with said MMSE criteria; and means for encoding said transform domain vector in accordance with said one selected codevector.

3. The apparatus of claim 2 wherein said means for transforming the input vector to provide said transform domain vector is provided by a Karhunen-Loewe Transform (KLT).

4. The apparatus of claim 2 wherein said means for transforming the input vector to provide said transform domain vector is provided by a discrete cosine transform (DCT).

5. The apparatus of claim 1 wherein said search procedure is conducted over said contiguous sub-group range in said codebook by comparison between the input vector and the codevector to determine the proper coding.

6. The apparatus of claim 2 wherein said hypersphere is defined as a relatively small k-dimensional sub-space centered around the input vector and containing the best matching codevector.

7. The apparatus of claim 2 wherein said means for determining said surface vector nearest to said transform domain vector on the principal axis p operates in accordance with the following relation:

$$Z_s = (Z_{tp} - Z_{sp})^2 \leq (Z_{tp} - Z_{np})^2 \; 1 \leq n \leq N$$

where $Z_s$ is the surface vector and $Z_t$ is the transform domain vector.

8. The apparatus of claim 7 wherein said principal axis search for said surface vector is by means of a binary search of the order of $Log_2 N$.

9. The apparatus of claim 2 wherein said means for determining the distance value providing the distortion between said transform domain vector $Z_t$ and said surface vector $Z_s$ applies the Euclidean distance in accordance with the relation:

$$d(Z_t, Z_s) = \sum_{i=1}^{k} (Z_{ti} - Z_{si})^2.$$

10. The apparatus of claim 2 wherein said means for determining said codebook contiguous sub-group range operates such that codevectors $Z_j$ contained therewithin are bounded by high and low bounds determined by $Z_h$, $Z_l$ where:

$$Z_{hp} < Z_{tp} + r_p < Z_{(h+1)p};$$

and $$Z_{(l-1)p} < Z_{tp} - r_p < Z_{lp}$$

thereby defining a hypersphere having a k-dimensional radius $r_p$ defined as:

$$r_p = \text{SQRT}\;(d(Z_t, Z_s)).$$

11. The apparatus of claim 2 wherein there is provided, in recursive fashion, a combined operation of the plurality of said means for determining said surface vector, means for determining said distance value, means for determining said codebook subgroup range in the hypersphere and means for performing said full search over the sub-group range within the hypersphere, such that each determination of a nearer codevector establishes it as the new nearest codevector, and initiates the repetition of said combined operation of the plurality of said means for determining the new hypersphere for the subsequent full search, wherein said means for determining said surface vector operates by substitution of the current surface vector for the new nearest codevector.

12. A method for encoding speech represented by a random input vector having k components, said method comprising the steps of:

pre-processing to provide off-line reorganization of a codebook having a set of reference vector patterns constituting codevectors with which the input vector is to be compared in a search procedure, said pre-processing step comprising the steps of:

transforming each of said codebook codevectors to provide a transform domain representation of said codebook;

determining a principal axis p having the largest variance in said codebook transform domain representation; and re-ordering said codebook codevectors according to their descending value on the p axis; and encoding the random input vector through on-line quantization in accordance with said search procedure in the codebook, said on-line encoding step comprising the steps of:

transforming the input vector to provide a transform domain vector having a set of eigenvectors associated therewith;

determining a surface vector nearest to said transform domain vector on said principal axis;

determining a distance value providing the distortion between said transform domain vector and said surface vector, said distance value being defined as the Euclidean distance between said vectors and being the Minimum Mean Square Error (MMSE) distortion criteria;

determining a codebook contiguous sub-group range having contained therewithin codevectors and being bounded by a hypersphere having a k-dimensional radius defined as the square root of said distance value;

performing a full search over said contiguous sub-group range within said hypersphere to select the one of said codevectors nearest to said transform domain vector by determining the distortion therebetween in accordance with said MMSE criteria; and encoding said transform domain vector in accordance with said one selected codevector.

13. The method of claim 12 wherein said on-line encoding step is performed by a source coder in a communication system providing optimal vector quantization and reducing computational complexity.

14. The method of claim 12 wherein said step of transforming the input vector to provide said transform domain vector is performed by a Karhunen-Loewe Transform (KLT).

15. The method of claim 12 wherein said step of transforming the input vector to provide said transform domain vector is performed by a discrete cosine transform (DCT).

16. The method of claim 12 wherein said search procedure is conducted over said contiguous sub-group range in said codebook by comparison between the input vector and the codevector to determine the proper coding.

17. The method of claim 12 wherein said hypersphere is defined as a relatively small k-dimensional sub-space centered around the input vector and containing the best matching codevector.

18. The method of claim 12 wherein said surface vector determination nearest to said transform domain vector on the principal axis p is performed in accordance with the following relation:

$$Z_s = (Z_{tp} - Z_{sp})^2 \leq (Z_{tp} - Z_{np})^2 \quad 1 \leq n \leq N$$

where $Z_s$ is the surface vector and $Z_t$ is the transform domain vector.

19. The method of claim 18 wherein said principal axis search for said surface vector is performed as a binary search of the order of $Log_2 N$.

20. The method of claim 12 wherein said distance value determination providing the distortion between said transform domain vector $Z_t$ and said surface vector $Z_s$ applies the Euclidean distance in accordance with the relation:

$$d(Z_t, Z_s) = \sum_{i=1}^{k} (Z_{ti} - Z_{si})^2.$$

21. The method of claim 12 wherein said codebook contiguous sub-group range determination defines codevectors $Z_j$ contained therewithin which are bounded by high and low bounds determined by $Z_h$, $Z_l$ where:

$$Z_{hp} < Z_{tp} + r_p < Z_{(h+1)p};$$

and $$Z_{(l-1)p} < Z_{tp} - r_p < Z_{lp}$$

thereby defining a hypersphere having a k-dimensional radius $r_p$ defined as:

$$r_p = SQRT\ (d(Z_t, Z_s)).$$

22. The method of claim 12 wherein there is provided, in recursive fashion, a combined operation of the plurality of said steps of determining said surface vector, determining said distance value, determining said codebook sub-group range in the hypersphere and performing said full search over the sub-group range within the hypersphere, such that each determination of a nearer codevector establishes it as the new nearest codevector, and initiates the repetition of said combined operation of the plurality of said steps for determining the new hypersphere for the subsequent full search, wherein said step of determining said surface vector is performed by substitution of the current surface vector for the new nearest codevector.

* * * * *

UNITED STATES PATENT AND TRADEMARK OFFICE
CERTIFICATE OF CORRECTION

PATENT NO. : 4,907,276
DATED : March 6, 1990
INVENTOR(S) : Shabtai Adlersberg

It is certified that error appears in the above-identified patent and that said Letters Patent is hereby corrected as shown below:

[75]    Inventor:    Shabtai Aldersberg, Ramat Gan, Israel should read

[75]    Inventor:    Shabtai Adlersberg, Ramat Gan, Israel

Signed and Sealed this

Twenty-first Day of April, 1992

Attest:

HARRY F. MANBECK, JR.

*Attesting Officer*    *Commissioner of Patents and Trademarks*